United States Patent [19]

Tashiro et al.

[11] 4,105,892

[45] Aug. 8, 1978

[54] THIN RESISTOR FILM TYPE THERMAL HEAD FOR PRINTING ON HEAT-SENSITIVE PAPER

[75] Inventors: Mitsuhiko Tashiro, Kawasaki; Shouzou Takeno, Yokohama; Kakuo Mihara, Yokohama; Tadayoshi Kinoshita, Yokohama, all of Japan

[73] Assignee: Tokyo Shibaura Electric Co., Ltd., Kawasaki, Japan

[21] Appl. No.: 816,144

[22] Filed: Jul. 15, 1977

[30] Foreign Application Priority Data

Jul. 19, 1976 [JP] Japan .................. 51-85008

[51] Int. Cl.$^2$ .............................................. H05B 1/00
[52] U.S. Cl. ................................ 219/216; 219/543; 346/76 R
[58] Field of Search .............. 219/216, 388, 543; 346/76 R

[56] References Cited

U.S. PATENT DOCUMENTS 3,518,406 6/1970 Janning ........................... 219/216

OTHER PUBLICATIONS

Umezawa et al., Journal of Theses of Electric Telecommunication Society, 55-c (1972).
Neugebauer, Thin Solid Films, 6 (1970), 443–447.

Primary Examiner—C. L. Albritton
Attorney, Agent, or Firm—Oblon, Fisher, Spivak, McClelland & Maier

[57] ABSTRACT

A thin resistor film type thermal head for printing on heat-sensitive paper, wherein a thin film of Ta—SiO$_2$ containing 7 to 53 mol% of SiO$_2$ or a thin film of Ta—SiO$_2$—N containing 7 to 53 mol% of SiO$_2$, molar ratio of Ta to N being 1:0.5 to 1:1 is used as a heat-generating resistor.

4 Claims, 7 Drawing Figures

THIN RESISTOR FILM TYPE THERMAL HEAD FOR PRINTING ON HEAT-SENSITIVE PAPER

BACKGROUND OF THE INVENTION

This invention relates to a thin resistor film type thermal head used in printing on heat-sensitive paper.

A thermal head for printing on heat-sensitive paper comprises a large number of thin minute heat-generating resistor films arranged linearly or in the matrix form. Desired printing on heat-sensitive paper is effected by selectively introducing current through the heat-generating resistor films thus arranged. Known thermal heads for printing on heat-sensitive paper include not only a thin resistor film type but also a thick resistor film type and a semiconductor resistor type.

Generally, a thin resistor film type thermal head has the advantages over a thick resistor film type that heat-generating resistor dots can be arranged with a higher density, more saves power consumption, makes a quicker response to heat, and carries out printing more speedily. However, the thin resistor film type thermal head raises problems in respect of manufacturing cost and power withstanding characteristic.

For a distinct printed image, it is necessary to reduce the size of heat-generating dots in order to arrange them with a higher density. At present, however, a thin resistor film type thermal head is often constructed by arranging heat-generating resistor dots at the rate of 5 to 8 dots per millimeter in consideration of various factors such as problems in manufacturing technique, driving circuits and electrical connection therewith. Heat-generating resistor dots used at present mostly have a square shape or a rectangular shape whose longitudinal and crosswise sides bear the ratio of 2:1 at maximum.

Power of about 0.1 to 0.5W is required per resistor to cause a plurality of heat-generating resistors jointly to produce a sufficient amount of heat for coloration of heat-sensitive paper. The higher the density of resistor dots, the smaller the area thereof. Accordingly, the resistor dots increase in power density with the resultant decline in power withstanding characteristic.

The resistance of the respective heat-generating resistors is subject to certain limitations by different factors such as driving circuit and power source, and has a considerably wide range of variation, depending on the design of, for example, the driving circuit. However, heat-generating resistors in general use have a resistance of scores of or hundreds of ohms. If falling in resistance, the heat-generating resistor increases in current capacity, raising, for example, the problem that the resistance of a lead and circuit, etc. can not be overlooked. Conversely, where the heat-generating resistor unduly rises in resistance, the thermal head tends to be impressed with undesirably high voltage.

Hitherto, a thin resistor film used with a thermal head has generally been of a Ta—N type mainly consisting of tantalum and nitrogen. This Ta—N type resistor film is prepared by sputtering tantalum in an atmosphere of argon mixed with nitrogen. The larger the content of nitrogen, the higher the resistance of the resistor film. However, a heat-generating resistor has generally been formed of a $Ta_2N$ system having good reliability and stability.

This $Ta_2N$ system has a specific resistance of about $200\mu\Omega$-cm. For increased resistance, the $Ta_2N$ type heat-generating resistor film has to be made thin and be shaped into the form of an elongate dot. However, manufacture of the $Ta_2N$ type resistor film is subject to certain technical limitations. Namely, the $Ta_2N$ type resistor film should be made as thin as hundreds of Å units in order to have a dot shape and a desired degree of resistance. For example, the $Ta_2N$ type resistor film should take an elongate dot form whose longitudinal and crosswise sides bear a ratio of 2:1, and also have a thickness of about 200Å in order to have a resistance of 200 ohms. However, the formation of such a thin $Ta_2N$ resistor film is accompanied with various problems, for example, that difficulties arise in controlling the $Ta_2N$ resistor film to be made uniformly thin to the above-mentioned extent; the reproducibility and uniformity of resistance decrease; and elevated current density would likely lead to the destruction of the $Ta_2N$ resistor film.

For elimination of the above drawbacks, an attempt has been proposed to convert an ordinary square heat-generating resistor 1 into a linear form as illustrated in FIGS. 1a and 1b. In these FIGS. 1a and 1b, reference numeral 2 indicates individual electrodes and reference numeral 3, common electrode. These constructions have been devised as an attempt to increase the resistance of a heat-generating resistor film without unduly reducing its thickness. However, this attempt has the drawback that the required greater density and higher resistance of thin dot-shaped resistor films demand a more advanced patterning technique, leading to a decline in yield.

SUMMARY OF THE INVENTION

This invention is intended to provide heat-generating thin resistor films adapted to be used with a thermal head for printing on heat-sensitive paper which are free from the drawbacks of the conventional $Ta_2N$ type resistor films and whose resistance can be set at a desired level without unduly reducing the thickness of the resistor films, while freely selecting the dot shape and thickness thereof according to the required density with which the resistor films are arranged in the form of dots.

Namely, the object of this invention is to provide a thin resistor film type thermal head for printing on heat-sensitive paper, which is characterized in that a thin film prepared from a system of $Ta—SiO_2$ or $Ta—N—SiO_2$ is used as a heat-generating resistor.

DETAILED DESCRIPTION OF THE PREFERRED EMBODIMENTS

A thin heat-generating resistor film prepared from a system of Ta—$SiO_2$ or Ta—N—$SiO_2$ according to this invention can have its specific resistance freely controlled by adjusting the content of $SiO_2$.

Figure 1A:
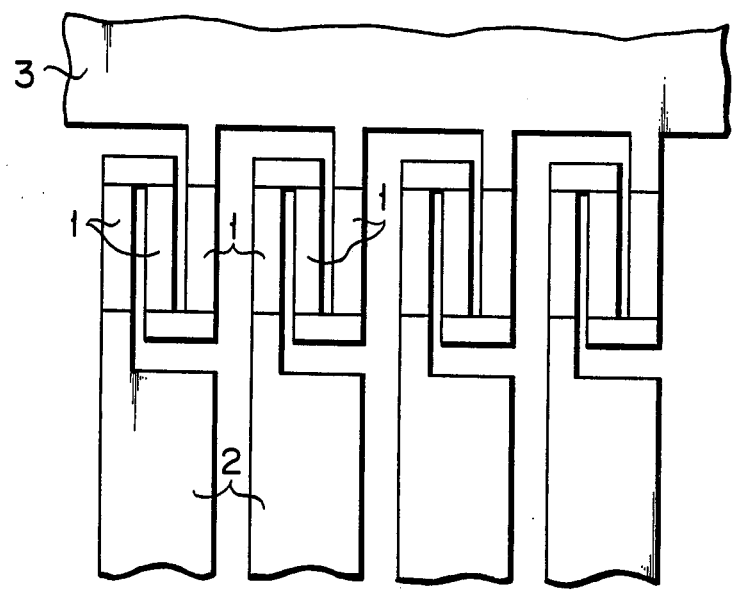
FIGS. 1a and 1b schematically illustrate the construction of the prior proposed thermal head.
Figure 1B:
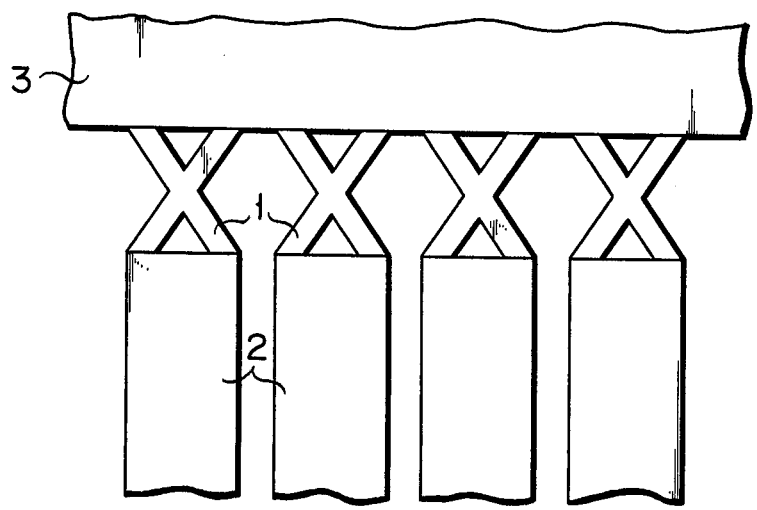
Figure 2:
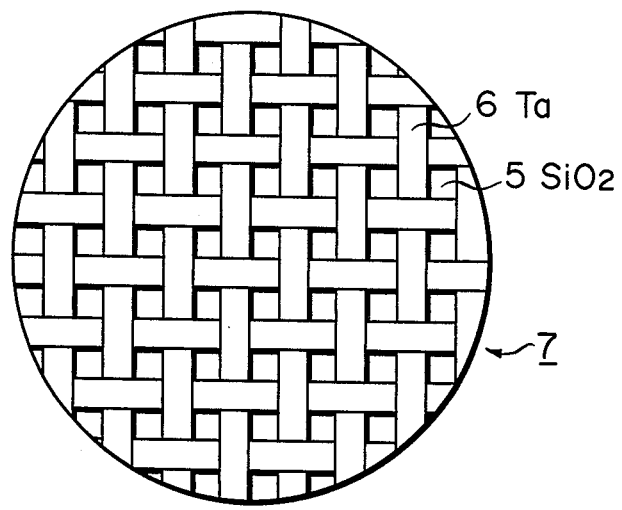
FIG. 2 is a front view of a target of sputtering used in manufacturing a thermal head embodying this invention.

The above-mentioned thin heat-generating resistor film of the invention can be practically manufactured by pasting ribbons 6 of tantalum on a substrate 5 of $SiO_2$, for example, in the braided lattice form, as shown in FIG. 2 and supplying sputtering on a target 7 formed of the Ta ribbons 6 and $SiO_2$ substrate 5 in an atmosphere of argon (Ar) or a mixture of argon (Ar) and nitrogen ($N_2$), thereby providing a thin resistor film of Ta—$SiO_2$ or Ta—N—$SiO_2$. In this case, the $SiO_2$ content of the resistor film can be controlled by changing the ratio of the total area of tantalum tapes to the total exposed area of the underlying substrate of $SiO_2$, thereby making it possible to vary the specific resistance of the thin resistor film easily and freely.

Figure 3:
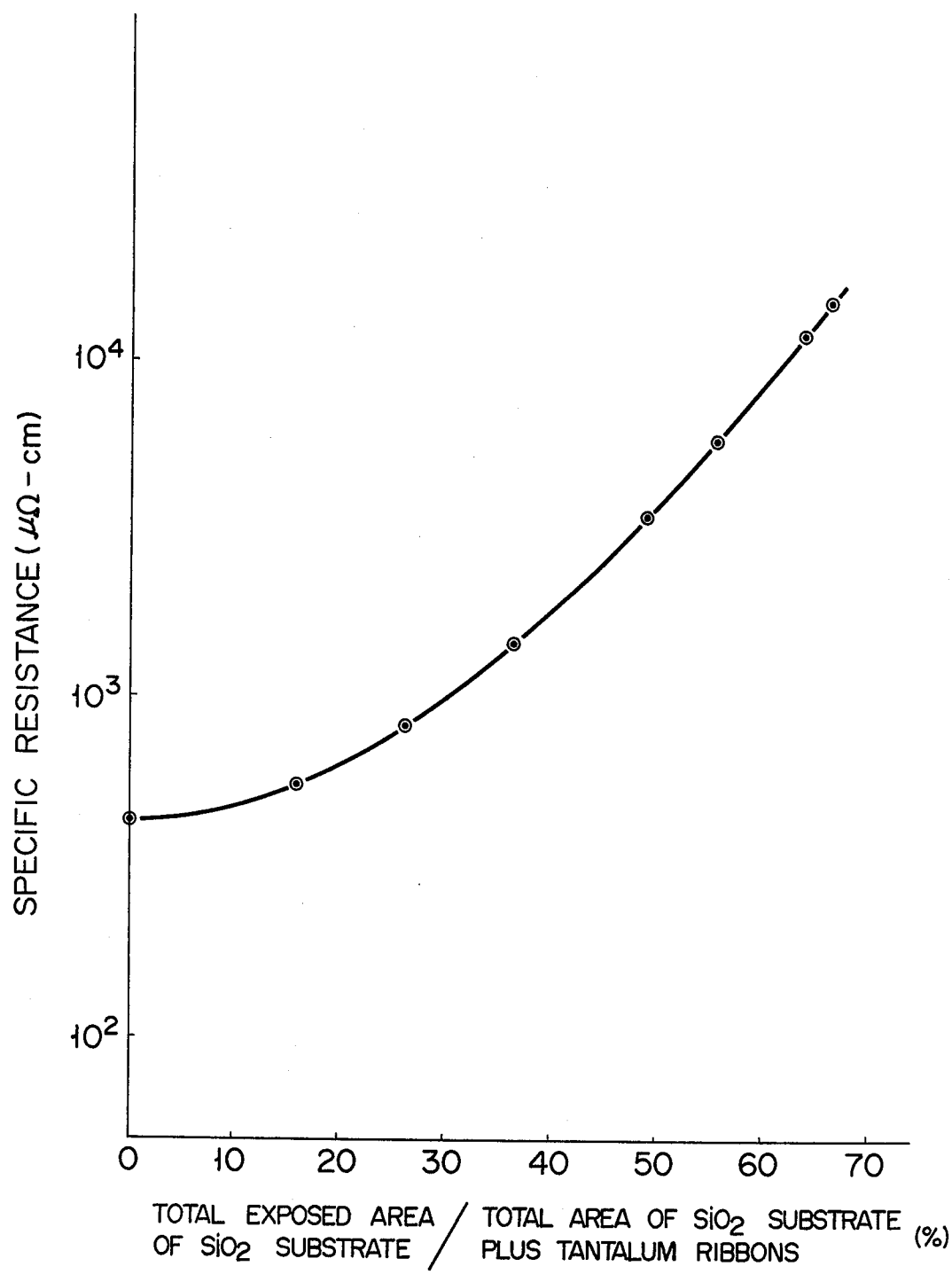
FIG. 3 is a curve diagram showing relationship between the specific resistance of a resistor film used with the thermal head of the invention and the construction of a target of sputtering.

FIG. 3 shows relationship between the ratio of the total exposed area of the $SiO_2$ substrate 5 to the total area of said $SiO_2$ substrate 5 plus tantalum ribbons 6 both constituting the target 7 and the specific resistance of a thin resistor film obtained by sputtering the Ta ribbons 6 and $SiO_2$ substrate 5. Though the specific resistance of the resistor film can be controlled, as seen from FIG. 3, by varying the above-mentioned area ratio, yet production of a resistor film having a higher resistance than about $10^4 \mu\Omega$-cm naturally causes the total exposed area of the $SiO_2$ substrate 5 to have a larger ratio to the total area of Ta ribbons 6, presenting difficulties in controlling such high resistance of the resistor film due to its specific resistance being sharply increased.

Since the Ta ribbons 6 and $SiO_2$ substrate 5 are sputtered at different rates, the specific resistance of a resistor film can be varied over an appreciably broad range by changing the pressure of argon used as an atmosphere of sputtering and the voltage of sputtering. However, these conditions largely depend on the type and performance characteristics of a sputtering device and can not be uniformly defined. In any case, a thin resistor film used with a thermal head is preferred to have a specific resistance ranging between 500 and 8,000$\mu\Omega$-cm, and, whether prepared from a Ta—$SiO_2$ or Ta—N—$SiO_2$ system, contain 7 to 53 or more desirably 17 to 42 mol% of $SiO_2$. (In Ta—N—$SiO_2$ system, molar ratio of Ta to N is preferably 1:0.5 to 1:1.) For practical purpose, it is advised to adopt suitable conditions according to the type and performance characteristics of a sputtering device and the kinds of target material used.

A target of sputtering may be prepared not only by pasting ribbons of tantalum on a $SiO_2$ substrate in the braided lattice form as shown in FIG. 2, but also from a sintered mass of Ta and $SiO_2$. A sintered mass of Ta and $SiO_2$ enables a resistor film to be formed with higher reproducibility. Since, however, proportions of Ta and $SiO_2$ are fixed in sputtering, the sintered mass of Ta and $SiO_2$ fails to admit of the effective control of the composition of a resistor film being prepared. Therefore, the sintered mass of Ta and $SiO_2$ is more preferred for quantity production of a thermal head, provided the conditions of manufacture are taken to be the same.

This invention will be more fully understood by reference to the examples which follow.

EXAMPLE 1

Tantalum was sputtered to a thickness of about 500Å on a glazed alumina substrate measuring 50mm × 50mm × 1mm by the ordinary direct current or radio frequency sputtering device. The sputtered tantalum was formed into $Ta_2O_5$ by heat treatment at 550° C for 2 hours in the atmosphere. Later, separate tantalum ribbons each having a width of 3mm and a thickness of 100 microns were braided in the form of a lattice, and pasted on a circular $SiO_2$ substrate 5 inches in diameter, thereby providing a target of sputtering as illustrated in FIG. 3, in which the ratio of the total exposed area of $SiO_2$ substrate to the total area of the tantalum ribbons was chosen to be 5.5:4.5. Therefore, sputtering was carried out 25 minutes by the ordinary bipolar radio frequency sputtering device under the following conditions:

Interelectrode distance: 3cm
$P_{Ar}$: $2 \times 10^{-2}$ torr
$P_{N_2}$: $3 \times 10^{-5}$ torr
Sputtering voltage: 1.8KV As the results, a resistor film of Ta—N—$SiO_2$ system was produced with a specific resistance P of 6,000$\mu\Omega$-cm and a thickness of 3,000Å. Further, electrode layers of chromium, palladium and gold were thermally deposited on the resistor film in the order mentioned as counted from the surface thereof with thicknesses of 500Å, 1,000Å and 1 micron respectively. Later, the laminated mass of these electrode layers was etched by photoetching through the ordinary photoresist to bore an elongate opening 160 microns wide and 40mm long to expose the resistor film. The exposed portion of the resistor film was masked with a comb-shaped electrode strip in which the respective tooth-shaped electrode member 130 microns wide projected from the base portion of the electrode strip at a space of 36 microns. The electrode layers of gold, palladium and chromium and the resistor film of Ta—N—$SiO_2$ were etched in succession by photoetching through the ordinary photoresist to convert the elongate exposed portion of the resistor film into heat-generating elongate dots. A wear-resistant film of $Ta_2O_5$ was sputtered to a thickness of about 6 to 10 microns on the above-mentioned heat-generating elongate dots, after those portions of the electrode layers of Au, Pd, Cr and the comb-shaped masking electrode strip which were to be connected to external lines were properly covered to prevent the deposition of said wear-resistant film of $Ta_2O_5$.

A thermal head thus prepared displayed the properties that the heat-generating resistor film had a resistance of about 250 ohms; a limit voltage to deterioration was 11 volts; and where supplied $10^8$ times with pulses having a width of 5 milliseconds and cycle time of 10 milliseconds at 9 volts, then the resistor film indicated resistance changes only falling within the range of ±2%.

EXAMPLE 2

Tantalum was sputtered to a thickness of about 500Å on a glazed alumina substrate by the ordinary direct current or radio frequency sputtering device. The sputtered tantalum was formed into $Ta_2O_5$ by heat treatment at 550° C for 2 hours in the atmosphere. Later, separate tantalum ribbons 3mm wide and 100 microns thick were braided in the form of a lattice as illustrated in FIG. 2, and pasted on a circular $SiO_2$ substrate 5 inches in diameter, thereby providing a target of sputtering, in which the ratio of the total exposed area of the SiO$_2$ substrate to the total area of taltalum ribbons was chosen to be 1:1. Sputtering was carried out 5 minutes on a target as shown in FIG. 3 by the ordinary bipolar radio frequency sputtering device under the following conditions:

Interelectrode distance: 3cm
$P_{Ar}$: $2 \times 10^{-2}$ torr
Sputtering voltage: 1.8KV As the results, a resistor film of Ta—SiO$_2$ system was produced with a specific resistance P of 3,600$\mu\Omega$-cm and a thickness of 2,000Å. Later electrode layers of chromium, palladium and gold were thermally deposited on the resistor film of Ta—SiO$_2$ in the order mentioned as counted from the surface thereof with thicknesses of 500Å, 1,000Å and 1 micron respectively. The laminated electrode layers of gold, palladium and chromium were etched by photoetching through the ordinary photoresist to bore an elongate opening 160 microns wide and 40mm long. The exposed portion of the resistor film was masked with a comb-shaped electrode strip in which the respective tooth-shaped electrode members 130 microns wide projected from the base portion of the electrode strip at a space of 36 microns. The electrode layers of gold, palladium and chromium and the resistor film of Ta—SiO$_2$ were etched in succession by photoetching through the ordinary photoresist to convert the elongate exposed portion of the resistor film into heat-generating elongate dots. A wear-resistant film of Ta$_2$O$_5$ was sputtered to a thickness of about 6 to 10 microns on the above-mentioned heat-generating elongate dots, after those portions of the electrode layers of Cr, Pd, Au and the comb-shaped masking electrode strip which were to be connected to external lines were properly covered to prevent the deposition of said wear-resistant film of Ta$_2$O$_5$.

A thermal head thus prepared displayed the properties that the heat-generating resistor film had a resistance of about 230 ohms; a limit voltage to deterioration was 10.5 volts; and where supplied 10$^8$ times with pulses having a width of 5 milliseconds and cycle time of 10 milliseconds at 9 volts, then the resistor film indicated resistance changes only falling within the range of ±7%.

Figure 4:
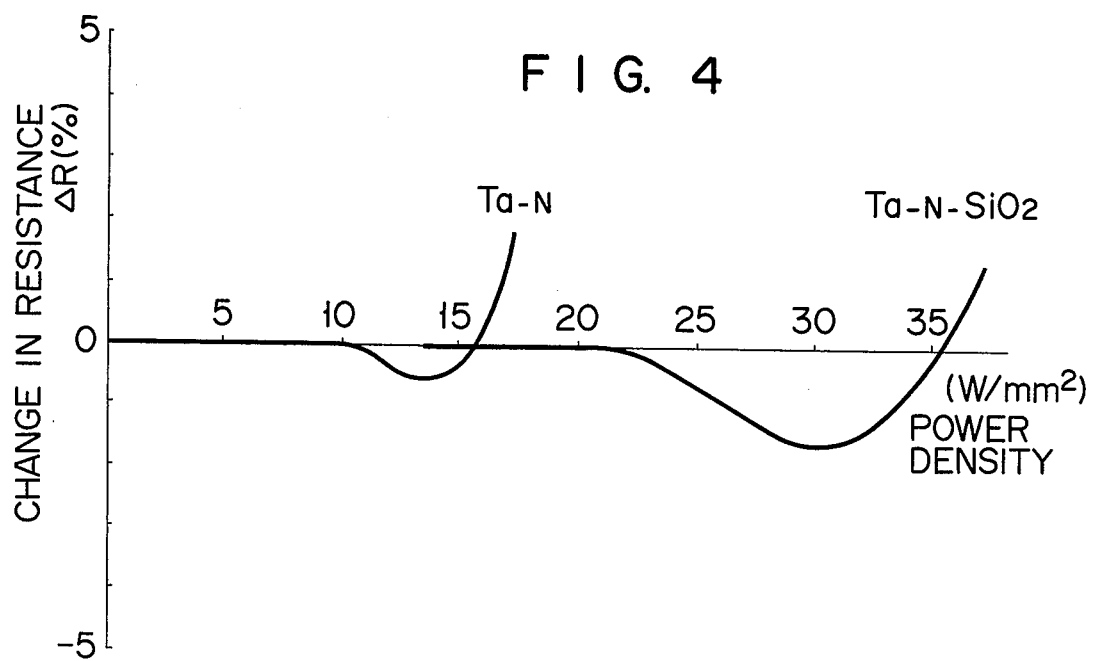
FIG. 4 indicates changes in the resistance of a resistor film as measured by a step stress test conducted on the thermal head of the invention as well as that of the control.
Figure 5:
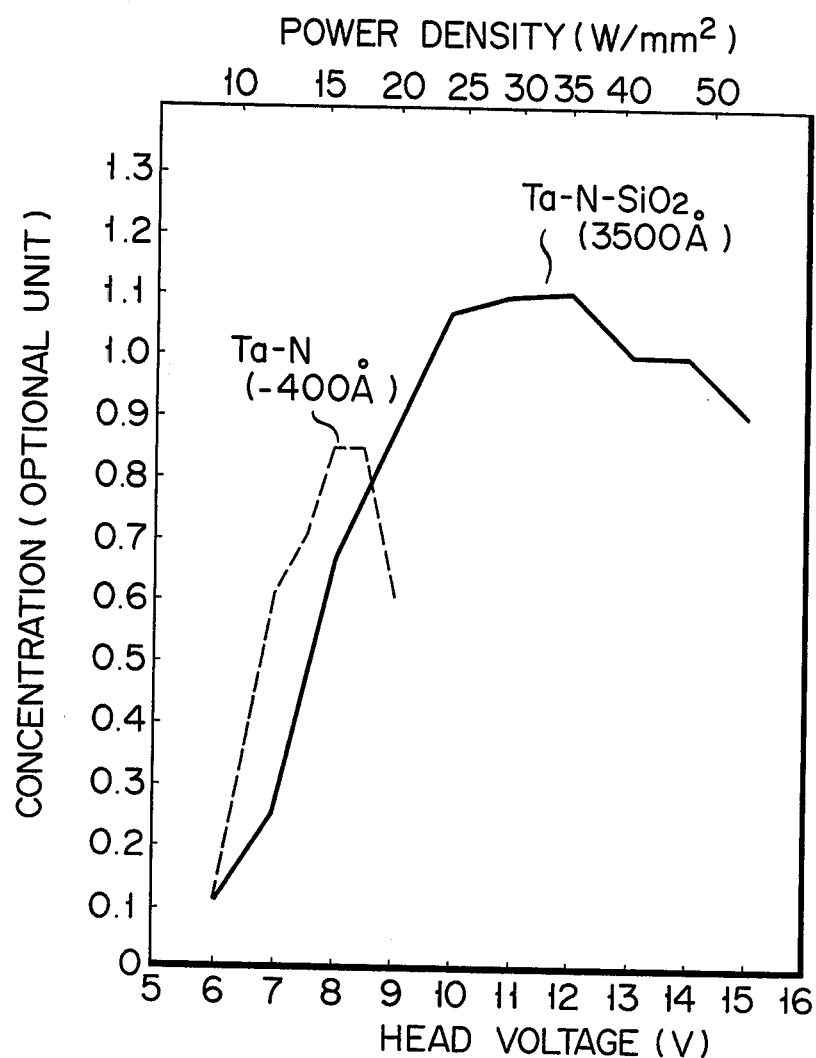
FIG. 5 graphically shows the characteristics of the thermal head of the invention and that of the control relative to the shade of a printed impression.

FIG. 4 shows the power withstanding characteristic of a thermal head comprising heat-generating dot-shaped resistor films prepared for trial from Ta—N and Ta—N—SiO$_2$ systems respectively by the process of Example 1, said dot-shaped resistor films being arranged with a density of 6 dots per millimeter, measuring 160 microns × 130 microns and having a resistance of 200 ohms, FIG. 5 indicates the shade of an impression made on heat-sensitive paper by means of these thermal heads. The power withstanding characteristic indicated in FIG. 5 denote the results of a step stress test conducted by supplying pulses of 5 milliseconds ON and 5 milliseconds OFF. The resistor film of Ta—N had a smaller thickness than 400Å and the resistor film of Ta—N—SiO$_2$ had a thickness of 3,500Å. Both resistor film had specific resistances of about 650$\mu\Omega$-cm and 5,700$\mu\Omega$-cm respectively.

The heat-generating resistor film of Ta—N—SiO$_2$ for more excelled, for example, in the power withstanding characteristics, the shade of a printed impression and the voltage margin of a thermal head than the heat-generating resistor film of Ta—N, proving that a satisfactory effect could be attained by increasing the specific resistance of a heat-generating resistor film and enlarging its thickness. The resistor film of Ta—N having an exceedingly small thickness is supposed to have a larger apparent specific resistance than actually is the case, but is considered simply to contain a larger amount of nitrogen than a resistor film of Ta$_2$N. Therefore, the resistor film of Ta$_2$N seems unadapted for practical application, because its thickness has to be considerably reduced.

Figure 6:
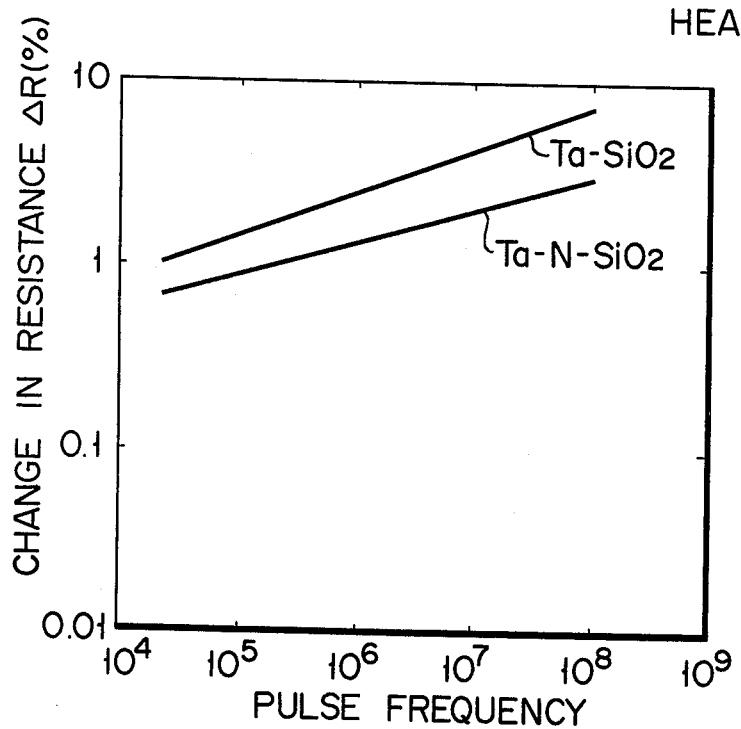
FIG. 6 is a curve diagram showing changes with time in the resistance of a resistor film used with the thermal head of the invention.

FIG. 6 shows the results of a test conducted to determine changes with time in the resistance of the resistor films of this invention prepared from Ta—SiO$_2$ and Ta—N—SiO$_2$. This test was carried out by supplying pulses having a width of 5 milliseconds to the above-mentioned resistor films each having a resistance of 200 ohms with a power of 25 W/mm$^2$ to determine changes with time in said resistance. The resistor film of Ta—SiO$_2$ makes it unnecessary to apply N$_2$ gas at the time of sputtering and has the advantage of more easily controlling the conditions of sputtering and attaining the higher reproducibility of a resistor film, but has the drawback that a resistor film produced loses reliablility and stability. However, a resistor film of Ta—SiO$_2$ whose resistor changes to a smaller extent than 10% is fully available for use with the ordinary apparatus for printing on heat-sensitive paper.

As mentioned above, a thermal head can be manufactured with for more excellent properties than has been possible in the past, if it comprises a heat-generating resistor film prepared from Ta—SiO$_2$ or Ta—N—SiO$_2$ according to this invention.

What we claim is:

1. A thermal head for printing on heat-sensitive paper which comprises a thin heat-generating resistor film prepared from at least one system selected from the group consisting of Ta—SiO$_2$ and Ta—N—SiO$_2$, wherein the content of SiO$_2$ in each system is 7 to 53 mol %.

2. The thermal head according to claim 1, wherein the heat-generating resistor film of Ta—SiO$_2$ contains 17 to 42 mol% of SiO$_2$.

3. The thermal head according to claim 1, wherein the heat-generating resistor film is prepared from a system of Ta—N—SiO$_2$ with the content of SiO$_2$ chosen to be 7 to 53 mol%, and molar ratio of Ta to N chosen to be 1:0.5 to 1:1.

4. The thermal head according to claim 3, wherein the resistor film of Ta—N—SiO$_2$ contains 17 to 42 mol% of SiO$_2$.

* * * * *